(12) United States Patent
Wong et al.

(10) Patent No.: US 11,399,449 B2
(45) Date of Patent: Jul. 26, 2022

(54) SERVER RACK COOLING ARRANGEMENT

(71) Applicant: NANYANG TECHNOLOGICAL UNIVERSITY, Singapore (SG)

(72) Inventors: Teck Neng Wong, Singapore (SG); Ranjith Kandasamy, Singapore (SG); Kok Chuan Toh, Singapore (SG); Jin Yao Ho, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 17/264,258

(22) PCT Filed: Jul. 26, 2019

(86) PCT No.: PCT/SG2019/050366
§ 371 (c)(1),
(2) Date: Jan. 28, 2021

(87) PCT Pub. No.: WO2020/027725
PCT Pub. Date: Feb. 6, 2020

(65) Prior Publication Data
US 2021/0307210 A1    Sep. 30, 2021

(30) Foreign Application Priority Data
Jul. 30, 2018   (SG) ............................ 10201806492U

(51) Int. Cl.
*H05K 7/20* (2006.01)
(52) U.S. Cl.
CPC ......... *H05K 7/20818* (2013.01); *H05K 7/202* (2013.01); *H05K 7/20318* (2013.01);
(Continued)
(58) Field of Classification Search
CPC ... H05K 7/20345; H05K 7/208–20818; H05K 7/20318; H05K 7/20327; H01L 23/4735
See application file for complete search history.

(56) References Cited

U.S. PATENT DOCUMENTS

| | | | | |
|---|---|---|---|---|
| 5,907,473 A | * | 5/1999 | Przilas | H05K 7/20345 174/15.1 |
| 5,943,211 A | * | 8/1999 | Havey | H01L 25/105 174/15.1 |

(Continued)

FOREIGN PATENT DOCUMENTS

CN    105658037 A    6/2016

OTHER PUBLICATIONS

Cader et al., "Liquid Cooling in Data Centers," *ASHRAE Transactions*: 231-241, 2009.

(Continued)

*Primary Examiner* — Zachary Pape
(74) *Attorney, Agent, or Firm* — Seed IP Law Group LLP

(57) ABSTRACT

A server rack cooling arrangement may include a server rack enclosure defining a single undivided interior volume of space and configured to be sealable; two or more open-frame-server-units disposed within the interior volume of space and arranged in a multi-level arrangement, wherein heat-producing-electronic-components may be exposed to environmental conditions of the interior volume of space; a central condenser disposed towards a rear; a coolant reservoir for collecting condensate from the central condenser; at least one nozzle in fluid communication with the coolant reservoir and configured to deliver fine coolant droplets into the interior volume of space for impingement on the heat-producing-electronic-components; and a fan configured to generate an airflow through the two or more open-frame-server-units from a front to the rear in a manner so as to carry coolant vapour generated from impingement of the fine coolant droplets on the heat-producing-electronic-components to the central condenser.

20 Claims, 7 Drawing Sheets

(52) U.S. Cl.
CPC ..... *H05K 7/20327* (2013.01); *H05K 7/20345* (2013.01); *H05K 7/20836* (2013.01)

(56) References Cited

U.S. PATENT DOCUMENTS

| | | | | |
|---|---|---|---|---|
| 6,349,760 | B1* | 2/2002 | Budelman | H01L 23/427 165/80.4 |
| 6,571,569 | B1 | 6/2003 | Rini et al. | |
| 7,043,933 | B1 | 5/2006 | Knight | |
| 7,184,269 | B2* | 2/2007 | Campbell | H05K 7/20781 174/15.1 |
| 8,194,406 | B2 | 6/2012 | Campbell et al. | |
| 2003/0177774 | A1* | 9/2003 | Malone | H01L 23/4735 62/171 |
| 2006/0026983 | A1* | 2/2006 | Tilton | H05K 7/20345 257/E23.1 |
| 2010/0039773 | A1* | 2/2010 | Tilton | H05K 7/20345 361/699 |
| 2011/0069453 | A1 | 3/2011 | Campbell et al. | |
| 2017/0280593 | A1 | 9/2017 | Magallanes et al. | |

OTHER PUBLICATIONS

Cader et al., "Spray Cooling Thermal Management for Increased Device Reliability," *IEEE Transactions on Device and Materials Reliability* 4(4):605-613, 2004.

IDA Singapore, "Media Factsheet, Green Data Centre Programme," Annex A, 2016 (6 pages).

Lin et al., "Heat transfer characteristics of spray cooling in a closed loop," *International Journal of Heat and Mass Transfer* 46:3737-3746, 2003.

Miller, "Power Densities Edge Higher, But AI Could Accelerate the Trend," Apr. 26, 2018, URL: https://datacenterfrontier.com/rack-density-trends-higher-but-ai-could-boost-a-high-density-horizon/, download date Mar. 31, 2021, 16 pages.

National Environment Agency, "Data Centre Energy Efficiency Benchmarking: Final Report," 2012, 103 pages.

Pais et al., "Surface Roughness and Its Effects on the Heat Transfer Mechanism in Spray Cooling," *Journal of Heat Transfer* 114:211-219, 1992.

Tan et al., "Multi-nozzle spray cooling for high heat flux applications in a closed loop system," *Applied Thermal Engineering* 54:372-379, 2013.

Xie et al., "Multi-nozzle array spray cooling for large area high power devices in a closed loop system," *International Journal of Heat and Mass Transfer* 78:1177-1186, 2014,.

Xie et al., "Study of heat transfer enhancement for structured surfaces in spray cooling," *Applied Thermal Engineering* 59:464-472, 2013.

Xie et al., "Thermal effects on a pressure swirl nozzle in spray cooling," *International Journal of Heat and Mass Transfer* 73:130-140, 2014.

Zhang et al., "PDA measurements of droplet size and mass flux in the three-dimensional atomisation region of water jet in air cross-flow," *Experiments in Fluids* 28:29-35, 2000.

* cited by examiner

| | Average heat rejection capacity (kW) | Volume (m³) | Density (kW/m³) |
|---|---|---|---|
| Current commercial air cooled rack (42U) | <7** | ~1 | ~7 |
| Our lab-scale Spray Cooled Server (8U equivalent) | ~4 | 0.24 | ~16 |

FIG. 4E

SERVER RACK COOLING ARRANGEMENT

CROSS-REFERENCE TO RELATED APPLICATIONS

The present application claims the benefit of the Singapore patent application No. 10201806492U filed on 30 Jul. 2018, the entire contents of which are incorporated herein by reference for all purposes.

TECHNICAL FIELD

Various embodiments generally relate to a server rack cooling arrangement. In particular, various embodiments generally relate to a server rack cooling arrangement with closed loop spray cooling.

BACKGROUND

A large proportion of electricity consumed by data centres is generally due to the cooling system necessary to keep the servers operating reliably. Conventional cooling system rely on chillers and computer room air handlers to produce the cold air which is then passed through the information technology (IT) equipment to pick up the heat generated via sensible cooling. Air is however a poor heat transport medium, and therefore a substantial temperature difference is required between the cold supply air and the maximum specified component operating temperatures in order to achieve this cooling reliably. This results in high energy requirements in the cooling equipment (chillers, pumps, cooling towers and fans).

Majority of the conventional data centres use a hot-aisle/cold-aisle arrangement with chilled air supplied through an underfloor plenum from computer room air handlers (CRAHs) located at the periphery of server halls. Recently, the use of a rear-door heat exchanger (RDHx) is gaining acceptance as a means to avoid air distribution inside the server room, as the chilled water is piped all the way to the rack exit to absorb the heat from the servers. However, air is still the cooling medium inside the server rack carrying the heat to the chilled water in the server rack rear-door, although there is savings in chiller power because the chilled water can be supplied at a higher temperature.

Inside the server rack, the typical maximum specified junction and case temperatures of electronic components are 85° C. and 65° C., respectively. If the temperature threatens to exceed that, embedded sensors will throttle the performance in order to avoid damage to the components. However, in the conventional set-up, between the component surfaces and the coolant (chilled air) supply temperature, usually at 22° C. or lower, there are many "thermal resistances" which necessitate the big temperature differential. Firstly, because of the relatively low specific heat of air, and the need to limit airflow velocities in the rack due to pressure drop and noise considerations, the designed "average" air temperature increases through the server rack is usually about 10° C., i.e. average (mixed) outlet temperatures is around 32° C. However, because the flow over the heated components in the server rack is not uniform or well mixed, local air temperatures inside the server rack can reach a further 10° C. higher, i.e. around 42° C. The convective thermal resistance between the air and the component surfaces, again limited by acceptable velocity, accounts for the remaining 20° C. or more. In the case of high-power components, this convective resistance is typically reduced by the use of directly mounted heat sinks with or without a local fan (with its consequent energy consumption) in the conventional set-up.

Accordingly, there is a need for a more efficient cooling arrangement to address the above issues.

SUMMARY

According to various embodiments, there is provided a server rack cooling arrangement. The server rack cooling arrangement may include a server rack enclosure which may define a single undivided interior volume of space and which may be configured to be sealable to isolate the interior volume of space. The server rack cooling arrangement may further include two or more open-frame-server-units which may be disposed within the interior volume of space and which may be arranged in a multi-level arrangement. Heat-producing-electronic-components of respective open-frame-server-units may be exposed to environmental conditions of the interior volume of space. The server rack cooling arrangement may further include a central condenser disposed within the interior volume of space and towards a rear of the server rack enclosure. The server rack cooling arrangement may further include a coolant reservoir disposed with respect to the central condenser within the interior volume of space in a manner so as to collect condensate from the central condenser. The server rack cooling arrangement may further include at least one nozzle in fluid communication with the coolant reservoir. The at least one nozzle may be configured to deliver fine coolant droplets into the interior volume of space for impingement on the heat-producing-electronic-components. The server rack cooling arrangement may further include at least one fan configured to generate an air-vapour flow within the interior volume of space and through the two or more open-frame-server-units from a front of the server rack enclosure to the rear of the server rack enclosure in a manner so as to carry coolant vapour generated from impingement of the fine coolant droplets on the heat-producing-electronic-components to the central condenser.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 4E shows a table illustrating a density comparison between conventional air cooled server and the spray cooled server of the various embodiments based on the preliminary studies.

DETAILED DESCRIPTION

Figure 1:
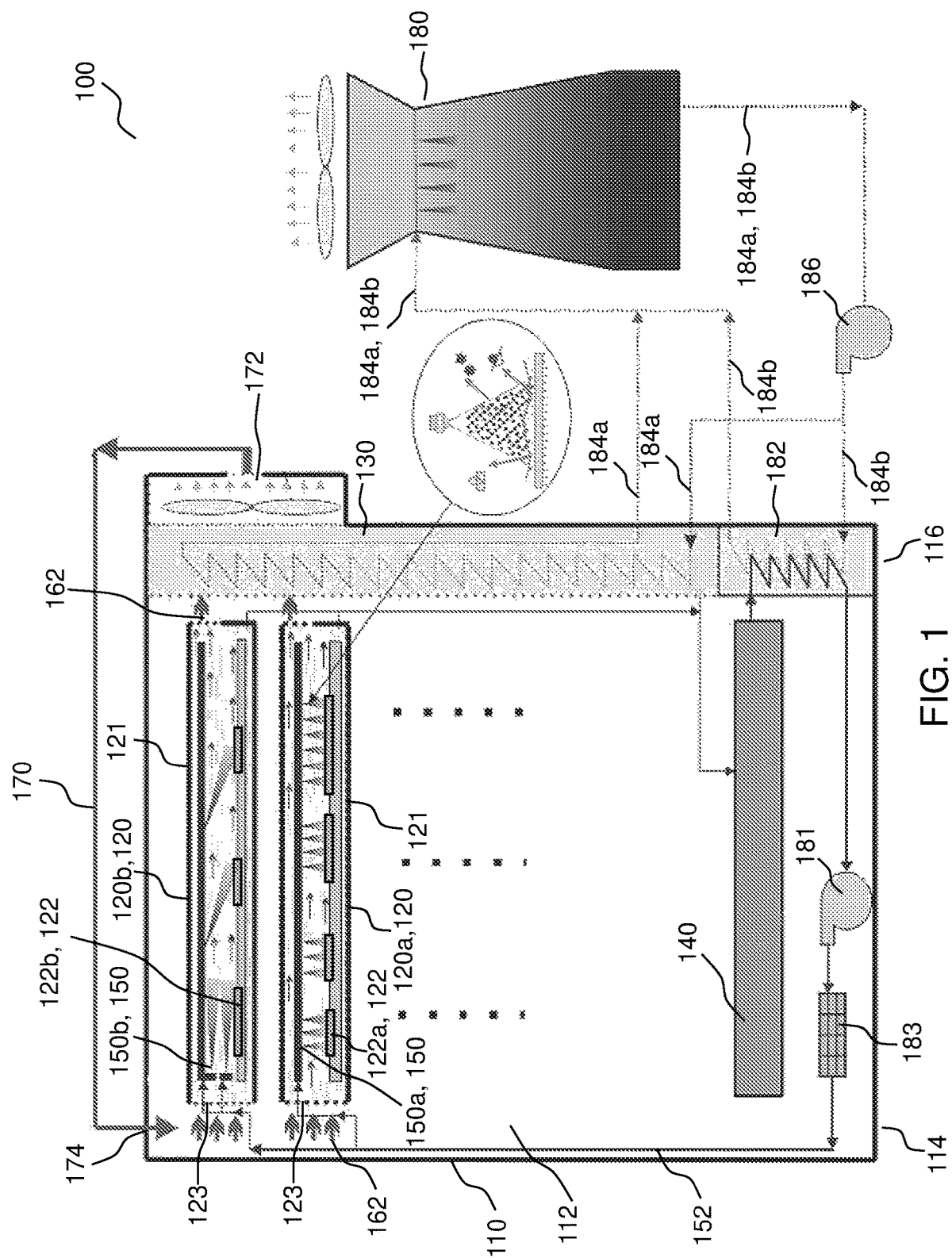
FIG. 1 shows a schematic diagram of a server rack cooling arrangement according to various embodiments.

Embodiments described below in the context of the apparatus are analogously valid for the respective methods, and vice versa. Furthermore, it will be understood that the embodiments described below may be combined, for example, a part of one embodiment may be combined with a part of another embodiment.

It should be understood that the terms "on", "over", "top", "bottom", "down", "side", "back", "left", "right", "front", "lateral", "side", "up", "down" etc., when used in the following description are used for convenience and to aid understanding of relative positions or directions, and not intended to limit the orientation of any device, or structure or any part of any device or structure. In addition, the singular terms "a", "an", and "the" include plural references unless context clearly indicates otherwise. Similarly, the word "or" is intended to include "and" unless the context clearly indicates otherwise.

Various embodiments generally relate to a server rack cooling arrangement. In particular, various embodiments generally relate to a server rack cooling arrangement with closed loop spray cooling. According to various embodiments, there may be provided a closed loop spray cooled system for data center cooling application. According to various embodiments, the closed loop spray cooled system for data center cooling application may include the server rack cooling arrangement according to the various embodiments. According to various embodiments, the closed loop spray cooled system for data center cooling application and/or the server rack cooling arrangement may seek to eliminate the need for chillers (the biggest energy consuming equipment) in the cooling system loop as well as reduce the energy requirements of the other associated equipment. According to various embodiments, the closed loop spray cooled system and/or the server rack cooling arrangement may be readily adapted to the current data centre cooling infrastructure without significant changes to the server room architecture and may be operated at above ambient temperature conditions.

According to various embodiments, the closed-loop spray cooling system for data center application and/or the server rack cooling arrangement may be achieved by evaporative/droplet impingement cooling effect whereby dielectric coolant may be distributed in small droplets through a spray nozzle such that the coolant droplets may absorb heat from the operating heated server components. According to various embodiments, the coolant droplets may vaporize and the vaporized coolant may then be condensed by a condenser coil which may be supplied with water at ambient temperature (i.e. no cooling required) from a cooling tower, through which the heat may be rejected to the environment and thereby closing the coolant loop.

According to various embodiments, the closed-loop spray cooling system for data center application and/or the server rack cooling arrangement may have the ability to maintain a more uniform temperature anywhere within the server rack enclosure. This is because the sprayed liquid evaporates at a fixed boiling point. Further, spray cooling according to various embodiments may enable maximum IT performance under reduced temperature which in turn may in fact increase reliability and life of IT components as compared to the conventional air cooling method. Various embodiments may have the capability of high heat flux removal in excess of liquid convection processes. According to various embodiments, a more compact cooling module at the heat source may be realized and this may lead to a higher IT load density/volume as compared to any cooling methods. According to various embodiments, mass flow rate required may be much lower as compared to single-phase air/liquid cooled systems.

Various embodiments may ensure minimal changes to the existing data center architecture and thus may be readily adapted. Various embodiments may also use a combination of target spray for high power components and mist spray for low power components which may eliminate any need for server fans to be operated.

According to various embodiments, the use of spray cooling may addresses the "thermal resistances" issues found in conventional air cooling system. According to various embodiments, spray cooling may use an array of spray nozzles placed such that they may impinge minute liquid droplets onto a heated surface where a thin liquid film forms removing heat through the combined processes of forced convection, evaporation and nucleate boiling, giving a high surface heat transfer coefficient (or low surface thermal resistance). According to various embodiments, for high power components, a heat sink may not be required as the direct impingement of the droplets may provide very high heat flux removal, and also avoid the need of an interface between the heat sink and the component surface. According to various embodiments, as the heat absorption may be largely by the evaporation mechanism, there may also not be a large temperature differential between the inlet and outlet conditions of the air/droplet mixture. According to various embodiments, local and mixed conditions may also not vary significantly because the liquid droplets may evaporate at a fixed boiling point as long as the system pressure is held constant. According to various embodiments, these effects may enable the air/coolant temperature in the server space to be maintained at around 45° C., allowing sufficient temperature budget for the heat to be subsequently rejected to the outdoor ambient conditions, without the need for a chiller plant.

According to various embodiments, since the air does not directly participate as the coolant but merely serve as the carrier for the spray droplets, its velocity may also be significantly reduced, leading to further savings in the air distribution system and lower noise levels.

As an illustrative example, the average Power Usage Effectiveness (PUE) of data centres in Singapore is 2.07 (NEA-HP, *Data Centre Energy Efficiency Benchmarking*, 2012, Singapore) because of the high redundancy and margin of safety often provided by operators, i.e. for 1 unit of power used by the server equipment, slightly more than 1 unit is used for auxiliary systems such as cooling, air distribution, UPS and power transmission losses, lighting and others. Using a spray-cooling system, with a carefully selected working fluid, various embodiments have the potential to eliminate the need for the chiller from the conventional cooling system. According to various embodiments, the only cooling system components consuming power may be pumps and cooling tower fans, which may typically take up only about 10% of the power, although slightly more pumping power may be needed to atomize the spray. According to various embodiments, the lower airflow requirements (because air serves as a carrier only as mentioned above) means that the air distribution power may be less than half (~40%). According to various embodiments, the reduction in equipment may also further reduce the cooling requirements and electrical losses. Therefore, a PUE of below 1.2 may be readily achievable with the various embodiments.

According to various embodiments, one of the major motivations of using the spray-cooled mechanism in the various embodiments versus other liquid-cooling systems may be that improvements to the energy efficiency may be achieved even in the short term. This is because the existing data centre layout architecture and infrastructure systems may be readily adapted to include the spray cooling system components of the various embodiments. In the medium to long term, it may of course be beneficial to achieve much denser packing of the racks and servers, as the spray cooled system of the various embodiments may dissipate much higher heat fluxes. On the other hand, existing racks may be loaded with much higher power data equipment with the implementation of the spray cooling system of the various embodiments, which may cater for expansion of the data centre capacity without increasing space requirements.

According to various embodiments, the conventional rear-door heat exchanger (RDHx) configuration however may lend itself readily to be adapted for spray cooling of the various embodiments. According to various embodiments, the RDHx may be replaced by a condenser coils to recover the vaporized spray coolant. According to various embodiments, the condenser coils may include arrays of tube banks which may be suitable for vapour condensation on external surfaces with the presence of non-condensable gas. According to various embodiments, the internal tube channels of the condenser coils may be supplied with return water from the cooling tower. According to various embodiments, since the vaporized spray coolant may have a condensation temperature higher than that of the condenser water supplied form the cooling tower, various embodiments may eliminate the chiller system as no chilled water may be required. According to various embodiments, air may also be drawn from the server room as a carrier for the spray droplets, but at a much lower flow rate as compared to conventional RDHx system. According to various embodiments, the air may also be at the outdoor air temperature or higher as the cooling function is mainly performed by the spray cooling.

Various embodiments may include additional adaptations that are configured to enable spray cooling. Various embodiments may be configured for spray atomization of the coolant so as to enable fine droplets to reach the server environment to absorb the heat. For example, a small form factor spray nozzle insert may be mounted on each individual server unit casing or over each high-power processor. According to various embodiments, the spray nozzle insert may be configured for targeted spray on a hot surface. According to various embodiments, the spray nozzle insert may also be adapted for volume or mist spray applications. In addition, the server rack may be configured to be sealed in order not to lose the vaporized spray coolant so that all the air-vapour mixture can be channelled to the condenser coil for recovery of the coolant. According to various embodiments, there may be provided means for drainage of the condensed coolant and pumping back to a manifold for redistribution to the spray nozzle inserts.

FIG. 1 shows a schematic diagram of a server rack cooling arrangement 100 (or a closed-loop evaporative spray system) according to various embodiments. According to various embodiments, the server rack cooling arrangement 100 may be applied to data centre cooling. According to various embodiments, dielectric coolant may be used in the server rack cooling arrangement 100. According to various embodiments, the server rack cooling arrangement 100 may be configured for both high flux (performance) components (e.g. processors/graphic chips) and low heat flux devices (e.g. memory/storage) populating the rest of the servers. According to various embodiments, the high performance components may have a directly mounted spray impingement module to manage the heat dissipation in accordance with their requirements to avoid hitting any performance bottlenecks, much like current heat sink/fan mounted devices—but with much higher upside performance because of the almost limitless spray impingement potential. According to various embodiments, the other components or lower density cards may be equipped with volume or mist spray nozzles that provide for general cooling of the server environment but still relying on the evaporating mechanism of the fine droplets so that temperature through the space may be relatively uniform, as compared to conventional air cooled servers which vary from a cool inlet to a warm outlet.

According to various embodiments, the server rack cooling arrangement 100 may include a server rack enclosure 110. According to various embodiments, the server rack enclosure 110 may define a single undivided interior volume of space 112. According to various embodiments, the interior volume of space 112 may be one continuous space enclosed by the server rack enclosure 110 in a manner such that the interior volume of space 112 may be without any partitions or separations for isolating or separating portions or regions of the interior volume of space 112. According to various embodiments, the entire interior volume of space 112 may be freely accessible between any two locations within the interior volume of space 112.

According to various embodiments, the server rack enclosure 110 may be configured to be sealable, as a whole, to isolate the interior volume of space 112 from the ambient environment (or the external surroundings). According to various embodiments, the server rack enclosure 110 may include at least one access panel (not shown). According to various embodiments, the at least one access panel may be configured to be openable so as to allow access into the interior volume of space 112 and closable so as to seal and isolate the interior volume of space 112 from the ambient environment (or the external surroundings). According to various embodiments, the server rack enclosure 110 may be provided with a seal or gasket around an access opening (not shown) such that the at least one access panel may engage with the seal or gasket to seal off the access opening in order for the server rack enclosure 110 to be air-tight or leak-proof.

According to various embodiments, the server rack cooling arrangement 100 may include two or more open-frame-server-units 120. According to various embodiments, the two or more open-frame-server-units 120 may include a frame 121 (or casing) which may have one or more apertures 123 (or holes or cavities or openings). According to various embodiments, the two or more open-frame-server units 120 may include server units that may not be fully enclosed or isolated by the frame or casing. According to various embodiments, the electronic components of respective open-frame-server-units 120 may be laid open or bare through the one or more apertures 123 (or holes or cavities or openings) of the frame 121 (or casing) of the respective open-frameserver-units 120. According to various embodiments, heat-producing-electronic-components 122 of the respective open-frame-server-units 120 may be exposed to environmental conditions of the interior volume of space 112 of the server rack enclosure 110. According to various embodiments, the open-frame-server-units 120 may be configured such that the heat-producing-electronic-components 122 of the respective open-frame-server-units 120 may be influenced by the environmental conditions of the interior volume of space 112 of the server rack enclosure 110 or may interact with the environmental conditions of the interior volume of space 112 of the server rack enclosure 110. According to various embodiments, the heat-producing-electronic-components 122 may include processors, microprocessors, graphic chips, memory, etc.

According to various embodiments, the two or more open-frame-server-units 120 may be disposed within the interior volume of space 112. According to various embodiments, the two or more open-frame-server-units 120 may be placed in the interior volume of space 112 so as to be contained inside the server rack enclosure 110. According to various embodiments, the two or more open-frame-server-units 120 may be arranged in a multi-level arrangement. According to various embodiments, the two or more open-frame-server-units 120 may be arranged one above another such that the two or more open-frame-server-units 120 may form multiple levels in a vertical direction. According to various embodiments, the server rack enclosure 110 may include two or more pairs of mounting holes (not shown) or mounting rails (not shown) arranged in a multi-level manner. According to various embodiments, the two or more pairs of mounting holes or mounting rails may be configured for mounting the two or more open-frame-server-units 120 to the server rack enclosure 110. According to various embodiments, each pair of mounting holes or mounting rails may be at a same level on two opposing internal side walls of the server rack enclosure 110. According to various embodiments, each pair of mounting holes or mounting rails may be configured to engage with one open-frame-server-unit 120 so as to hold the open-frame-server-unit 120 in place inside the server rack enclosure 110.

According to various embodiment, the server rack cooling arrangement 100 may include a central condenser 130 disposed within the interior volume of space 112 and towards a rear 116 of the server rack enclosure 110. According to various embodiments, the central condenser 130 may be located at a back of the server rack enclosure 110, similar to the location of the conventional rear-door heat exchanger. According to various embodiments, the central condenser 130 may include arrays of tube banks formed by condensing coils. According to various embodiments, the central condenser 130 may form a catchment-zone in the interior volume of space 112 whereby air-vapour mixture, which may include a combination of air and coolant vapour, within the interior volume of space 112 may be moved through so as to remove coolant vapour from the air-vapour mixture via condensation of the coolant vapour.

According to various embodiments, the server rack cooling arrangement 100 may include a coolant reservoir 140 disposed with respect to the central condenser 130 within the interior volume of space 112 in a manner so as to collect condensate from the central condenser 130. According to various embodiments, the condensate collected may include liquid coolant condensed from coolant vapour by the central condenser. According to various embodiments, the coolant reservoir 140 may be disposed directly below the central condenser 130 to collect the condensate. According to various embodiments, the coolant reservoir 140 may be in fluid communication with collectors disposed below the central condenser 130. According to various embodiments, the coolant reservoir 140 may be disposed and arranged in any suitable manner so as to effectively collect condensate from the central condenser 130. According to various embodiments, the coolant may be dielectric coolant.

According to various embodiments, the server rack cooling arrangement 100 may include at least one nozzle 150 in fluid communication with the coolant reservoir 140. According to various embodiments, the at least one nozzle 150 may be connected to the coolant reservoir 140 by a fluid flow line 152 in a manner such that the liquid coolant in the coolant reservoir 140 may flow from the coolant reservoir 140 to the at least one nozzle 150 via the fluid flow line 152. According to various embodiment, the at least one nozzle 150 may be configured to deliver fine coolant droplets into the interior volume of space 112 for impingement on the heat-producing-electronic-components 122. According to various embodiments, the at least one nozzle 150 may be configured to discharge liquid coolant from the coolant reservoir 140 as fine coolant droplets. According to various embodiments, the at least one nozzle 150 may be configured to directly spray the fine coolant droplets at the heat-producing-electronic-components 122. Accordingly, the fine coolant droplets may directly impinge on the heat-producing-electronic-components 122 and be vaporized so as to cool the heat-producing-electronic-components 122. According to various embodiments, the at least one nozzle 150 may be configured to disperse the fine coolant droplets in the form of a mist into the interior volume of space 112 in a manner such that the fine coolant droplets may be suspended in the interior volume of space 112. The suspended fine coolant droplets, which may be in motion, may come into contact with and/or impinge on the heat-producing-electronic-components 122 and be vaporized so as to cool the heat-producing-electronic-components 122. According to various embodiments, the server rack cooling arrangement 100 may include an array of nozzle 150.

According to various embodiments, the server rack cooling arrangement 100 may include at least one fan 160 configured to generate an air-vapour flow 162 within the interior volume of space 112. According to various embodiments, the at least one fan 160 may move or agitate the air-vapour mixture within the interior volume of space 112 to produce a movement in the form of the air-vapour flow 162. According to various embodiments, the air-vapour flow 162 generated by the at least one fan 160 may flow through the two or more open-frame-server-units 120 from a front 114 of the server rack enclosure 110 to the rear 116 of the server rack enclosure 110. According to various embodiment, the front 114 of the server rack enclosure 110 and the rear 116 of the server rack enclosure 110 may be opposite sides of the server rack enclosure 110. According to various embodiments, the air-vapour flow 162 may be movement of air from the front 114 of the server rack enclosure 110 to the rear 116 of the server rack enclosure 110 via passing through the multi-level arrangement of the two or more open-frame-server-units 120. According to various embodiments, the air-vapour flow 162 may be in a manner so as to carry coolant vapour generated from impingement of the fine coolant droplets on the heat-producing-electronic-components 122 to the central condenser 130, which is at the rear of the server rack enclosure 110. According to various embodiments, coolant vapour may be moved by the air-vapour flow 162 towards and into the central condenser 130 such that the coolant vapour may be condensed into condensate. According to various embodiments, the air-vapour flow 162 may also carry the fine coolant droplets suspended in the air-vapour mixture for contacting with and/or impinging on the heat-producing-electronic-components 122.

According to various embodiments, the at least one nozzle 150 may include a first nozzle 150a and a second nozzle 150b. According to various embodiments, the first nozzle 150a may be oriented with a spray axis perpendicular to a surface of a first heat-producing-electronic-component 122a. According to various embodiments, the first nozzle 150a may be oriented with a spray axis perpendicular to the air-vapour flow 162. According to various embodiments, the first nozzle 150a may be configured to directly spray the fine coolant droplets at the first heat-producing-electronic-components 122a in a manner such that the fine coolant droplets may directly impinge on the first heat-producing-electronic-components 122a and be vaporized so as to cool the first heat-producing-electronic-component 122a. According to various embodiments, the first nozzle 150a may include a direct spray impingement nozzle.

According to various embodiments, the second nozzle 150b may be oriented with a spray axis inclined or parallel with respect to the air-vapour flow 162. According to various embodiments, the second nozzle 150b may be oriented with a spray axis inclined or parallel to a surface of a second heat-producing-electronic-component 122b. According to various embodiments, the second nozzle 150b may be configured to disperse the fine coolant droplets in the form of a mist in a direction inclined or parallel with respect to the air-vapour flow 162 (or inclined or parallel to a surface of a second heat-producing-electronic-component 122b) in a manner such that the fine coolant droplets may be suspended and may be in motion so as to pass and come into contact with and/or impinge on the second heat-producing-electronic-components 122b and be vaporized so as to cool the second heat-producing-electronic-components 122b. According to various embodiments, the second nozzle 150b may include a mist spray nozzle.

According to various embodiments, the first nozzle 150a may be disposed within a first 120a of the two or more open-frame-server-units 120. According to various embodiments, the first nozzle 150a may be configured to deliver fine coolant droplets for cooling the heat-producing-electronic-components 122a of the first open-frame-server-unit 120a. According to various embodiments, the second nozzle 150b may be disposed within a second 120b of the two or more open-frame-server-units 120. According to various embodiments, the second nozzle 150b may be configured to deliver fine coolant droplets for cooling the heat-producing-electronic-components 122b of the second open-frame-server-unit 120b. According to various embodiments (not shown), the first nozzle 150a and the second nozzle 150b may be disposed within the same open-frame-server-unit 120. According to various embodiments, the first nozzle 150a and the second nozzle 150b may be configured for cooling different heat-producing-electronic-components 122 of the same open-frame-server-unit 120.

According to various embodiments, the server rack cooling arrangement 100 may include a return duct 170 (or recirculation duct) connecting the rear 116 of the server rack enclosure 110 to the front 114 of the server rack enclosure 110. According to various embodiments, the return duct 170 may run outside/inside the server rack enclosure 110 from the rear 116 of the server rack enclosure 110 to the front 114 of the server rack enclosure 110. According to various embodiments, the return duct 170 may connect an outlet 172 of the server rack enclosure 110 (or an inlet of the return duct 170) located at the rear 116 of the server rack enclosure 110 to an inlet 174 of the server rack enclosure 110 (or an outlet of the return duct 170) at the front 114 of the server rack enclosure 110. According to various embodiments, the return duct 170 may be configured to recirculate air-vapour mixture which has passed through the central condenser 130 from the rear 116 of the server rack enclosure 110 back into the interior volume of space 112 via the front 114 of the server rack enclosure 110. According to various embodiments, the outlet 172 of the server rack enclosure 110 (or the inlet of the return duct 170) may be located after or beyond the central condenser 130 in the direction of the air-vapour flow 162. According to various embodiments, the inlet 174 of the server rack enclosure 110 (or the outlet of the return duct 170) may be located before or ahead of the two or more open-frame-server-units 120 in the direction of the air-vapour flow 162.

According to various embodiments, the server rack cooling arrangement 100 may include at least one circulation fan (not shown) coupled along the return duct 170. According to various embodiments, the at least one circulation fan may be configured to cause air to flow through the return duct 170 and to create a suction into the return duct 170 at the outlet 172 of the server rack enclosure 110 (or the inlet of the return duct 170).

According to various embodiments, the server rack cooling arrangement 100 may include a cooling tower/air-to-liquid heat exchanger 180 coupled to the central condenser 130. According to various embodiments, the cooling tower/air-to-liquid heat exchanger 180 may be configured to reject heat to the atmosphere. According to various embodiments, the cooling tower/air-to-liquid heat exchanger 180 may be located outside the building which house the server rack enclosure 110. According to various embodiments, the cooling tower/air-to-liquid heat exchanger 180 and the central condenser 130 may share a common piping water loop 184a. According to various embodiments, the water circulating inside the water loop 184a may remove heat from the central condenser 130 such that the central condenser 130 may condense the coolant vapour into liquid coolant. According to various embodiments, the cooling tower/air-to-liquid heat exchanger 180 may be configured to remove heat from the water loop 184a and reject the heat into the external atmosphere so as to cool the water inside the water loop 184a for circulating back to the central condenser 130.

According to various embodiments, the server rack cooling arrangement 100 may include a liquid-to-liquid heat exchanger 182 connected between the coolant reservoir 140 and the at least one nozzle 150. According to various embodiments, the liquid-to-liquid heat exchanger 182 may be configured to further cool the liquid coolant flowing from the coolant reservoir 140 to the at least one nozzle 150. According to various embodiments, the liquid-to-liquid heat exchanger 182 may be located along the flow line 152 between the coolant reservoir 140 and the at least one nozzle 150. According to various embodiments, the liquid-to-liquid heat exchanger 182 may be configured to transfer heat between two different liquids flowing through the liquid-to-liquid heat exchanger. According to various embodiments, the two liquids may be separated by solid wall to prevent mixing or direct contact. According to various embodiments, the liquid-to-liquid heat exchanger 182 may include two separate fluid paths running side-by-side to each other. According to various embodiments, the first fluid path may form part of the flow line 152 between the coolant reservoir 140 and the at least one nozzle 150 such that liquid coolant from the coolant reservoir 140 may flow through the liquidto-liquid heat exchanger 182 via the first flow path before reaching the at least one nozzle 150.

According to various embodiments, the cooling tower/air-to-liquid heat exchanger 180 may be also coupled to the liquid-to-liquid heat exchanger 182. According to various embodiments, the cooling tower/air-to-liquid heat exchanger 180 may be coupled to a second flow path of the liquid-to-liquid heat exchanger 182. According to various embodiments, the liquid-to-liquid heat exchanger 182 may share a common piping water loop 184b with the cooling tower/air-to-liquid heat exchanger 180 via the second flow path of the liquid-to-liquid heat exchanger 182. According to various embodiments, the water flowing through the second flow path of the liquid-to-liquid heat exchanger 182 may remove heat from the liquid coolant flowing through the first flow path of the liquid-to-liquid heat exchanger 182 such that the liquid coolant may be further cooled. According to various embodiments, the cooling tower/air-to-liquid heat exchanger 180 may be configured to remove heat from the water loop 184b and reject the heat into the external atmosphere so as to cool the water inside the water loop 184b for circulating back to the liquid-to-liquid heat exchanger 182.

According to various embodiments, the cooling tower/air-to-liquid heat exchanger 180 may be coupled to both the central condenser 130 and the liquid-to-liquid heat exchanger 182. According to various embodiments, a first water loop 184a may connect the cooling tower/air-to-liquid heat exchanger 180 to the central condenser 130. According to various embodiments, a second water loop 184b may connect the cooling tower/air-to-liquid heat exchanger 180 to the liquid-to-liquid heat exchanger 182. According to various embodiments, a portion of the first water loop 184a and a portion of the second water loop 184b may merge in a manner such that the cooling tower/air-to-liquid heat exchanger 180 may only have a single inlet and a single outlet. According to various embodiments, a water pump 186 may be connected to the cooling tower/air-to-liquid heat exchanger 180 for circulating the water from the cooling tower/air-to-liquid heat exchanger 180 to the central condenser 130 and/or the liquid-to-liquid heat exchanger 182.

According to various embodiments, the server rack cooling arrangement 100 may include a coolant pump 181 connected between the coolant reservoir 140 and the at least one nozzle 150. According to various embodiments, the coolant pump 181 may be configured to pump liquid coolant from the coolant reservoir 140 to the at least one nozzle 150. According to various embodiments, the coolant pump 181 may be located before or after the liquid-to-liquid heat exchanger 182 along the fluid flow line 152 between the coolant reservoir 140 and the at least one nozzle 150.

According to various embodiments, the server rack cooling arrangement 100 may include a filter 183 connected between the coolant reservoir 140 and the at least one nozzle 150. According to various embodiments, the filter 183 may be configured to remove contaminant from the liquid coolant before the liquid coolant flows into the at least one nozzle. According to various embodiments, the filter 183 may be located before at least one nozzle 150 along the fluid flow line 152.

According to various embodiments, each of the two or more open-frame-server-units 120 may include a first opening 124 directed towards the front 114 of the server rack enclosure 110 and a second opening 126 directed towards the rear 116 of the server rack enclosure 110. According to various embodiments, the air-vapour flow 162 within the interior volume of space 112 from the front 114 of the server rack enclosure 110 to the rear 116 of the server rack enclosure 110 may enter the respective open-frame-server-unit 120 via the first opening 124 and exit the respective open-frame-server-unit 120 via the second opening 126. According to various embodiments, the air-vapour flow 162 may flow through the respective open-frame-server-unit 120 and carry the coolant vapour, which may be generated within the respective open-frame-server-unit 120 from impingement of the fine coolant droplets on the heat-producing-electronic-components 122, out of the respective open-frame-server-unit 120 via the second opening 126. According to various embodiments, the air-vapour flow 162 through the respective open-frame-server-unit 120 may also move or agitate the fine coolant droplets, which may be delivered by the at least one nozzle 150 into the respective open-frame-server-unit 120 and which may be suspended within the respective open-frame-server-unit 120, for contacting with and/or impinging on the heat-producing-electronic-components 122 of the respective open-frame-server-unit 120.

Figure 2:
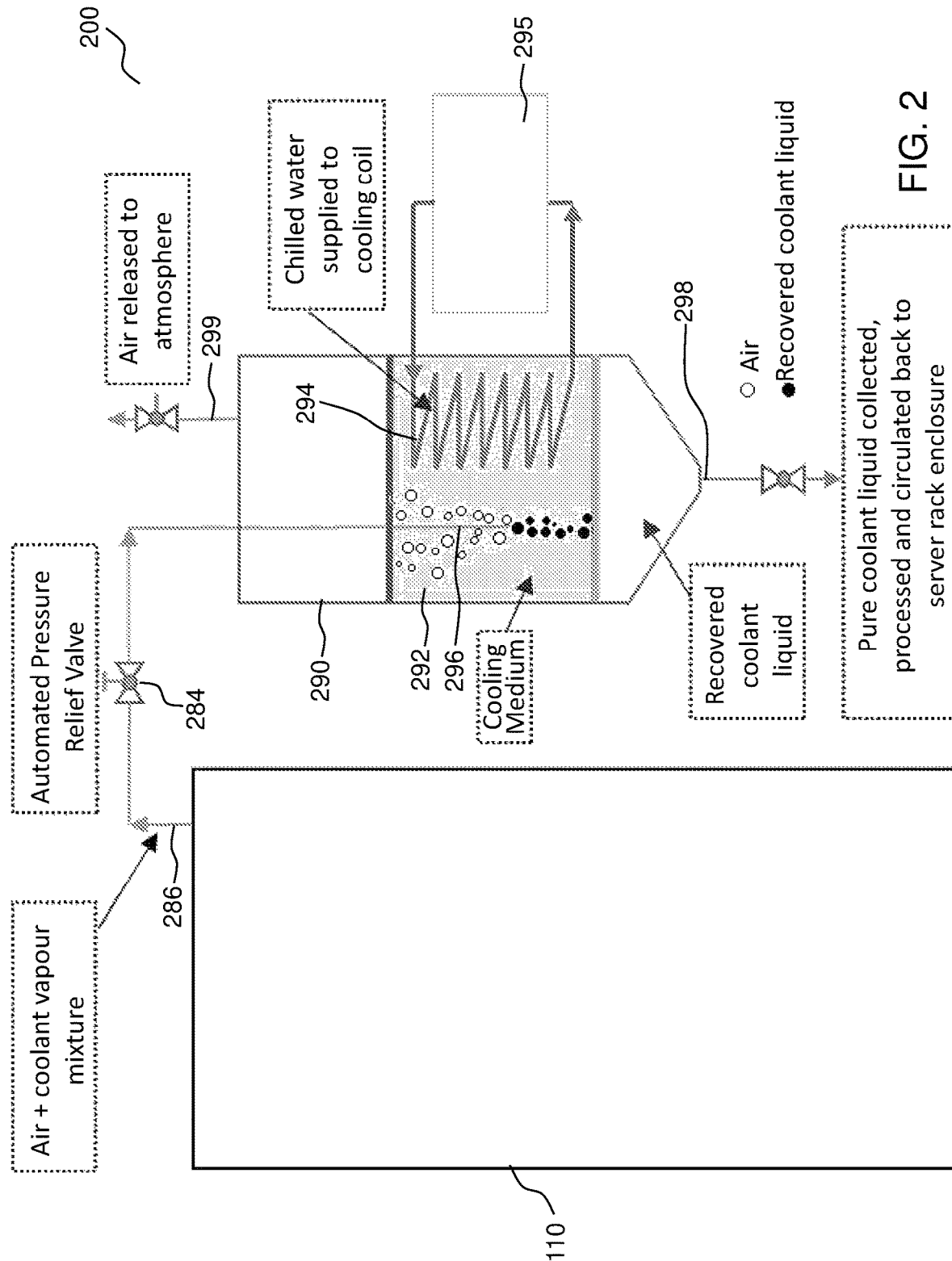
FIG. 2 shows a schematic diagram of a server rack cooling arrangement according to various embodiments.

FIG. 2 shows a schematic diagram of a server rack cooling arrangement 200 (or a closed-loop evaporative spray system) according to various embodiments. According to various embodiments, the server rack cooling arrangement 200 of FIG. 2 may contain all the features of the server rack cooling arrangement 100 of FIG. 1. Accordingly, all features, changes, modifications, and variations that are applicable to the server rack cooling arrangement 100 of FIG. 1 may also be applicable to the server rack cooling arrangement 200 of FIG. 2.

According to various embodiments, the server rack cooling arrangement 200 of FIG. 2 may, in addition to the features and limitations of the server rack cooling arrangement 100 of FIG. 1, further include a pressure relief valve 284. According to various embodiments, the pressure relief valve 284 may be configured to release air-vapour mixture from the interior volume of space 112 of the server rack enclosure 110. According to various embodiments, by releasing the air-vapour mixture, a pressure inside the interior volume of space 112 of the server rack enclosure 110 may be regulated. According to various embodiments, the pressure relief valve 284 may be coupled to the server rack enclosure 110. According to various embodiments, the pressure relief valve 284 may be coupled to an outlet vent 286 of the server rack enclosure 110. According to various embodiments, the pressure relief valve 282 may be automated. According to various embodiments, the automated pressure relief valve 282 may be controlled by a controller for automatic regulation of the pressure within the server rack enclosure 110.

According to various embodiments, the server rack cooling arrangement 200 of FIG. 2 may, in addition to the features and limitations of the server rack cooling arrangement 100 of FIG. 1, further include a vapour recovery tank 290 fluidly coupled to the pressure relief valve 284. According to various embodiments, the vapour recovery tank 290 may be configured to recover coolant from any coolant vapour that has escaped the server rack enclosure 110 via the pressure relief valve 284. According to various embodiments, the vapour recovery tank 290 may be a fully sealed vessel. According to various embodiments, the vapour recovery tank 290 may contain a cooling medium 292. According to various embodiments, the cooling medium 292 may be water or any fluid that is immiscible with dielectric fluid. According to various embodiments, the vapour recovery tank 290 may be at least half filled with the cooling medium 292. According to various embodiments, the vapour recovery tank 290 may include a cooling coil 294 immersed in the cooling medium 292 contained inside the vapour recovery tank 290. According to various embodiment, the cooling coil 294 may be submerged in the cooling medium 292 and may be configured to maintain the cooling medium 292 at a constant predetermined temperature. According to various embodiments, the constant predetermined temperature may be a temperature that may cool the coolant vapour such that the coolant vapour may condense into liquid coolant. According to various embodiments, the cooling coil 294 may be supplied with chilled water. According to various embodiments, the cooling coil 294 may form a water loop with a constant temperature bath 295. According to various embodiments, the constant temperature bath 295 may be maintain at the constant predetermined temperature for suppling the chilled water to the cooling coil 294. According to various embodiments, the vapour recovery tank 290 may include an inlet conduit 296 extending from the pressure relief valve 284 into the cooling medium 292 contained inside the vapour recovery tank 290. According to various embodiments, a portion of the inlet conduit 296 may be inserted into the cooling medium 292 in a manner such that air and coolant vapour mixture released from the server rack enclosure 110 may exit directly into the cooling medium 292. According to various embodiments, since the temperature of the cooling medium 292 may be sufficient to condense the coolant vapour, the coolant vapour may condense into liquid coolant upon coming into contact with the cooling medium 292 while the air may remain in the gaseous form. Accordingly, the liquid coolant may sink to a bottom region of the vapour recovery tank 290 while the remaining air may surface from the cooling medium 292 and rise to an upper region of the vapour recovery tank 290. According to various embodiments, the vapour recovery tank 290 may include a fluid outlet 298 at the bottom of the vapour recovery tank 290. According to various embodiments, the liquid coolant accumulated at the bottom of the vapour recovery tank 290 may be collected via the fluid outlet 298. According to various embodiments, the liquid coolant collected may be processed and circulated back to the at least one nozzle 150 through the coolant reservoir 140 for spray cooling inside the server rack enclosure 110. According to various embodiments, the vapour recovery tank 290 may include an air vent 299 at the top of the vapour recovery tank 290 for releasing the air recovered into the atmosphere.

According to various embodiments, as shown in FIG. 1 and FIG. 2, there is provided a server rack cooling arrangement (or a closed-loop evaporative spray system) including direct spray impingement modules and volume/mist spray modules in a sealed rack server (or a sealed server rack enclosure). According to various embodiments, the server rack cooling arrangement may include one or more direct mounted spray impingement modules/server units (see, for example, server unit 120a of FIG. 1). According to various embodiments, each direct mounted spray impingement module/server unit may include a direct spray impingement nozzle/nozzle array over high heat flux components. According to various embodiments, each direct mounted spray impingement module/server unit may include a feed chamber network for the direct spray impingement nozzles.

According to various embodiments, the server rack cooling arrangement may include one or more volume/mist spray modules/server units (see, for example, server unit 120b of FIG. 1). According to various embodiments, each volume/mist spray module/server unit may include a volume/mist spray nozzle for cooling low heat flux components. According to various embodiments, each volume/mist spray module/server unit may include an inclined spray nozzle network for low heat flux as well as space constraint cooling demand. According to various embodiments, each volume/mist spray module/server unit may include a feed chamber network for mist and inclined spray nozzles.

According to various embodiments, the server rack cooling arrangement may include an air-vapour delivery and recovery system (see, for example, the central condenser 130, the at least one fan 160, the cooling tower/air-to-liquid heat exchanger 180 and the water pump 181). According to various embodiments, the air-vapour delivery and recovery system may include condenser coils with arrays of tube banks for condensing/recovering coolant vapour and for sensible heat rejection of recirculated air from the spray modules/server units. According to various embodiments, the air-vapour delivery and recovery system may include an air-vapour recirculating fan along return ducts. According to various embodiments, the air-vapour delivery and recovery system may include a return duct network for efficient delivery of recirculated air-vapour back to the rack servers (or server rack enclosure). According to various embodiments, the air-vapour delivery and recovery system may include a recovery network for coolant condensate on condenser coils and in the return duct. According to various embodiments, the air-vapour delivery and recovery system may include external cooling tower and pump to dissipate heat from the condenser coils and to provide coolant to the loop respectively.

According to various embodiments, the server rack cooling arrangement may include a coolant liquid delivery and recovery system (see, for example, the coolant reservoir 140, the liquid-to-liquid heat exchanger 182, the coolant pump 181, the cooling tower/air-to-liquid heat exchanger 180, and the water pump 186)). According to various embodiments, the coolant liquid delivery and recovery system may include a sealed coolant reservoir for recovery and storage of coolant liquid from server units and condenser coils. According to various embodiments, the coolant liquid delivery and recovery system may include a coolant pump to recirculate coolant liquid to the server units. According to various embodiments, the coolant liquid delivery and recovery system may include a liquid-to-liquid heat exchanger to reject sensible heat of the coolant liquid from the coolant reservoir. According to various embodiments, the coolant liquid delivery and recovery system may include liquid manifolds to effectively deliver coolant to the server units through the feed chamber network. According to various embodiments, the coolant liquid delivery and recovery system may include at least one filter along the liquid manifolds for contaminant removal from the coolant. According to various embodiments, the coolant liquid delivery and recovery system may include a cooling tower/air-to-liquid heat exchanger and a pump to dissipate heat away from liquid-to-liquid heat exchanger and to provide coolant to the loop respectively.

According to various embodiments, the spray nozzle (or the at least one nozzle 150) may have characteristics such as compact size to fit in tight spaces in commercially available server (1U, 2U form factor), uniform droplet distribution, fine droplet size to suit the abovementioned requirements. According to various embodiments, the at least one nozzle may include a Jet-Swirl Nozzle. According to various embodiments, the Jet-swirl Nozzle may be one of a kind wherein the droplets within spray cone may be uniformly distributed and the spray quality may be controlled by just varying the pressure drop of the liquid across the nozzle. In principle, the Jet-swirl nozzle may integrate an un-swirled axial jet and swirled angular jets in a swirling insert or special nozzle structure component leading to the swirl chamber. According to various embodiments, these jets may interact in the swirl chamber and in the discharge orifice, so at the exit of discharge orifice a full cone spray may be obtained.

According to various embodiments, the jet-swirl nozzle may be configured to serve as an atomizer with a swirling insert configured according to the ideal liquid theory. According to various embodiments, the swirling insert may be mounted onto the nozzle plate to works as a jet-swirl nozzle. According to various embodiments, the swirling insert may be fabricated with one axial center port ($d_a$) and three swirling ports ($d_s$) with inclined angle ($\theta$) of 45°. According to various embodiments, the liquid jet entering the axial port together with the swirl jets coming from the swirling ports may interact in a swirl chamber which has an inner cone angle of 60°. Thereafter, the swirling liquid inside the swirl chamber may come out from the discharge orifice and may form a full cone spray with a relatively large spray cone angle. According to various embodiments, proportions of the swirled and un-swirled components may have to be properly selected for a spray with uniform radial distribution and relatively large spray cone angle. According to various embodiments, this may eliminate the non-uniform distributions typical of jet and swirl atomizers.

Cooling performance of the closed-loop spray cooling system for data center application and/or the server rack cooling arrangement according to the various embodiments was evaluated using a laboratory-based spray cooled system for server. Data from tests and experiments conducted on the laboratory-based spray cooled system for server are provided in the following.

In the various tests and experiments, a laboratory-scale closed loop spray cooled server test embodiment was configured and tested. The embodiment includes a rack enclosure/spray chamber (housing heat dissipating source i.e., one server and three simulated heater) with nozzle array, pump, a condenser coil (which is similar to coolant recovery condenser/RDHx as explained earlier), liquid-to-liquid heat exchanger, a fluid reservoir and set of regulating valves to control flow along the closed loop. In this embodiment, a pump supplies high pressure dielectric liquid/coolant (for example, per-fluoro series dielectric liquid) to the nozzle array. Further, the nozzle atomizes the liquid into high velocity, fine droplet spray covering the heat dissipating sources. The spray droplets impinging on the heated surface (for example, processor, DIMM or other server sub-components) may pick up the heat by various spray cooling mechanisms and changes phase into coolant vapour. In this embodiment, the coolant vapour is then circulated within the rack enclosure by server fans. The coolant vapour then passes through the condenser (supplied by ambient temperature water around 30° C.) placed adjacent to the heat source. Since the condenser surface temperature (30° C.) is maintained lower than the coolant vapour temperature, the coolant vapour may be condensed back to a subcooled liquid (or a condensate) on to the condenser surface. The subcooled liquid may be drained to the reservoir by properly designed gravity assisted drain channels within the spray chamber and circulated back to the pump thus closing the loop. In this embodiment, a target spray feed system was configured and custom built to suit or fit into a conventional 2U server configuration.

In this embodiment, pressure, flow rate and temperature sensors are installed at critical location to characterize the system performance. In this embodiment, a dedicated data logger is used to process the data from the sensors. To compare the cooling performance of conventional air cooled system for the server versus spray cooling system of the various embodiments for the server, both experiments were conducted in their respective controlled environment and the inbuilt temperature of each of the server components, especially processor (which is the high heat flux generating component in a typical server) were recorded. For both the cases, the processors were subjected to same clocking frequency which generates same amount of heat.

Figure 3A:
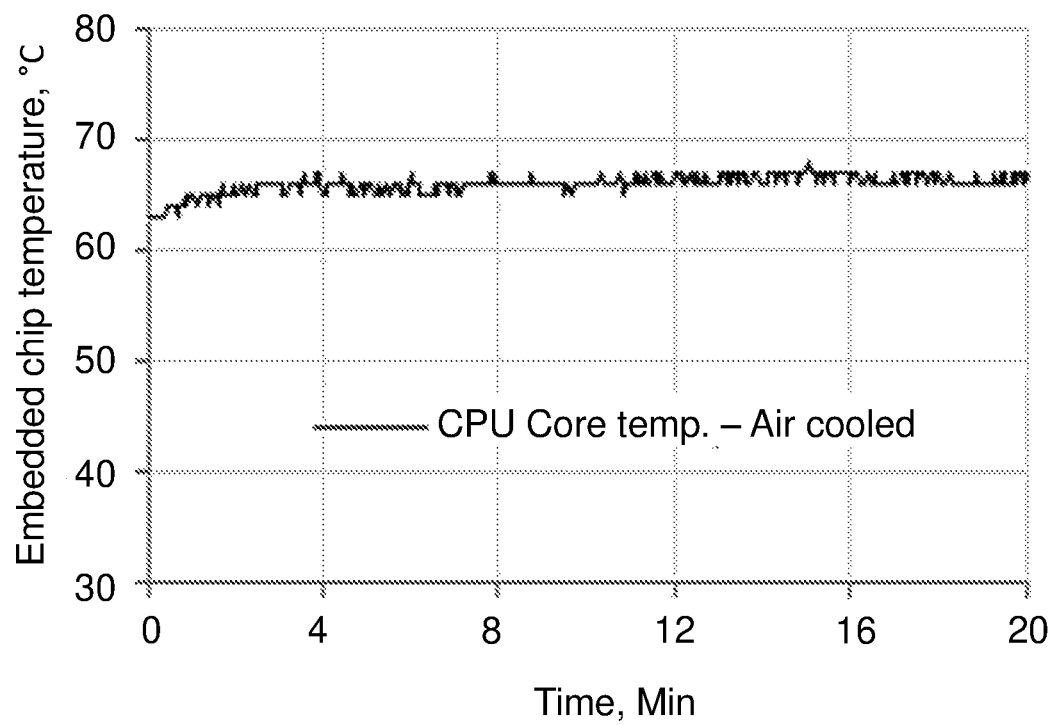
FIG. 3A shows embedded chip temperature profile of processors for air cooled system according to various embodiments.
Figure 3B:
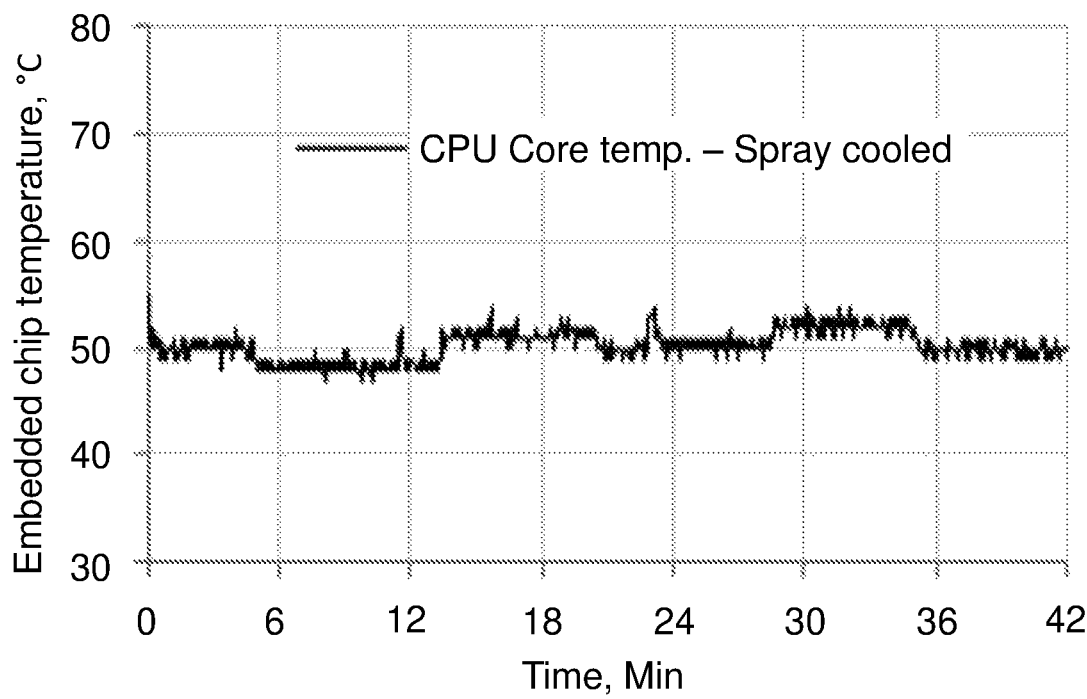
FIG. 3B shows embedded chip temperature profile of processors for spray cooled system according to various embodiments.
Figure 3C:
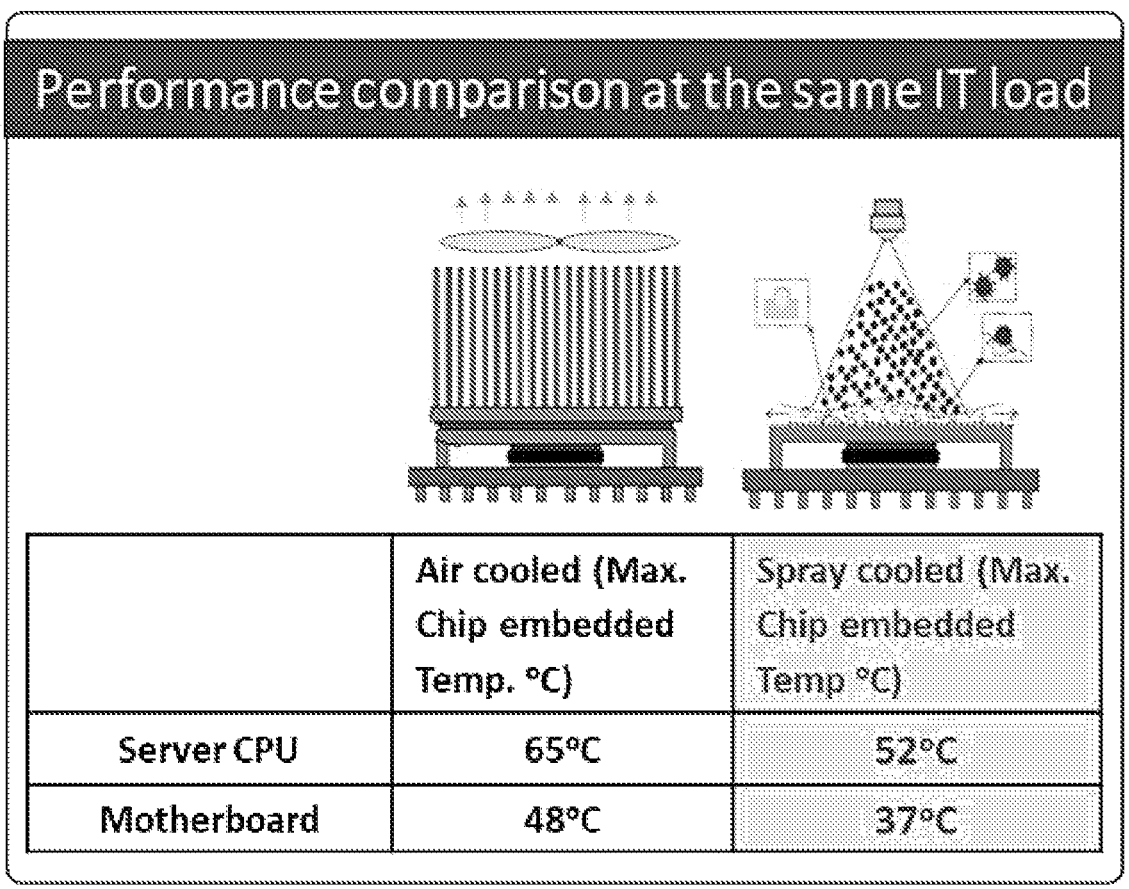
FIG. 3C shows a performance comparison of server run under air cooled system and spray cooling system.

FIG. 3A shows embedded chip temperature profile of processors for air cooled system. FIG. 3B shows embedded chip temperature profile of processors for spray cooled system according to various embodiments. FIG. 3C shows a performance comparison of server run under air cooled system and spray cooling system. Accordingly, FIG. 3A and FIG. 3B show a comparison of embedded chip temperature profile of processors over server operating time. As shown, the 2U server (or two rack unit server) retrofitted with spray cooling system operates 14-15° C. lower compared to air cooled 2U server run under same computational load. Further, the results of server's processor and motherboard temperature are summarized in tabular form as shown in FIG. 3C.

According to various embodiments, spray chamber pressure may be considered to be one of the critical operating parameters for stable continuous operation of close loop spray cooled system of the various embodiments. Operating and maintaining chamber pressure close to ambient pressure (1.008 bar) may be a desirable operating condition for the system since this may influence the structural integrity of the spray chamber (i.e. rack enclosure) and reduce the fluid losses. According to various embodiments, condenser may be one of the several pressure control features included in the system for controlling the spray chamber pressure within operating limits. According to various embodiments, the condenser may be considered to be the primary pressure control feature in the spray cooled system of the various embodiments. According to various embodiments, the configuration of the condenser may influence the efficiency of condensation which in turn may influence the ability to condense coolant vapour effectively in the presence of air in the system. According to various embodiments, other pressure control features may include varying (for example, increasing or decreasing) flow rate to the spray nozzle, varying (for example, reducing or increasing) supply liquid temperature to the spray nozzle, and/or incorporating automatic pressure relief valve (PRV) to release pressure from spray chamber at certain set point values to the atmosphere or a coolant vapour recovery system.

Referring back to FIG. 2, which shows a vapour recovery system being a part of the server rack cooling arrangement 200 (or the closed-loop evaporative spray system). According to various embodiments, when the server rack cooling arrangement 200 is under operation, the pressure inside the server rack enclosure 110 (or the spray cooled rack enclosure) may be regulated by one of the abovementioned methods of which one may use the pressure relief valve 284 to release the air-vapour mixture to atmosphere. When the air-vapour mixture is released to the atmosphere, this may contribute to unnecessary loss of expensive coolant liquid (i.e. dielectric liquid) from the system during operation. According to various embodiments, in order to recover the coolant liquid from the released air-vapour mixture, an efficient coolant vapour recovery system may be employed so that operational cost of the server rack cooling arrangement 200, due to loss of coolant, may be minimized. According to various embodiments, the vapour recovery system may include the vapour recovery tank 290 (or the vapour recovery enclosure), the cooling coil 294 and a set of valves to control the rate of air-vapour mixture coming into the vapour recovery tank 290 and the rate of air release from it. According to various embodiments, the vapour recovery tank 290 may be filled with water and the cooling coil 294 may always be thermally in contact with the water. According to various embodiments, the cooling coil 294 in the vapour recovery system may be supplied with chilled water in the temperature range of 10-25° C. According to various embodiments, the pressure relief valve 284 may be automated. According to various embodiments, during operation of the server rack cooling arrangement 200, the automatic pressure relief valve 284 may sense higher pressure in the server rack enclosure 110 and may vent the pressure to the vapour recovery system as shown in FIG. 2. According to various embodiments, since the pressure in the vapour recovery system may always be maintained lower than that in the server rack enclosure 110, the air-vapour mixture may naturally flows to the vapour recovery tank 290. According to various embodiments, then the warm air-vapour mixture comes in direct thermal contact with the cold water in the vapour recovery tank 290, the coolant vapour may condense back to liquid and tiny droplets of condensed coolant liquid (i.e. dielectric liquid) may drop to the bottom of the vapour recovery tank 290 (see FIG. 2). According to various embodiments, the coolant liquid (i.e. dielectric liquid) may be heavier than water (higher density) and immiscible with water. Due to these thermo-physical properties of these two liquids, they may always stay separated in the vapour recovery tank 290. According to various embodiments, the non-condensable air from the air-vapour mixture may naturally rise to the top of vapour recovery tank 290 and may then be released to the atmosphere from the vapour recovery system. According to various embodiments, the coolant liquid (i.e. the dielectric liquid) collected at the bottom of the vapour recovery tank 290 may be recovered by slowly opening valves at the bottom of the vapour recovery tank 290. According to various embodiments, the collected liquid may then be passed through series of filters to remove any excess water and then recirculated back to the server rack cooling arrangement 200. According to various embodiments, the vapour recovery system may be in operation only during the pressure regulation phase of the server rack cooling arrangement 200. Once the desired pressure is achieved in the server rack cooling arrangement 200, the vapour recovery system may be turned off to save energy.

Figure 4A:
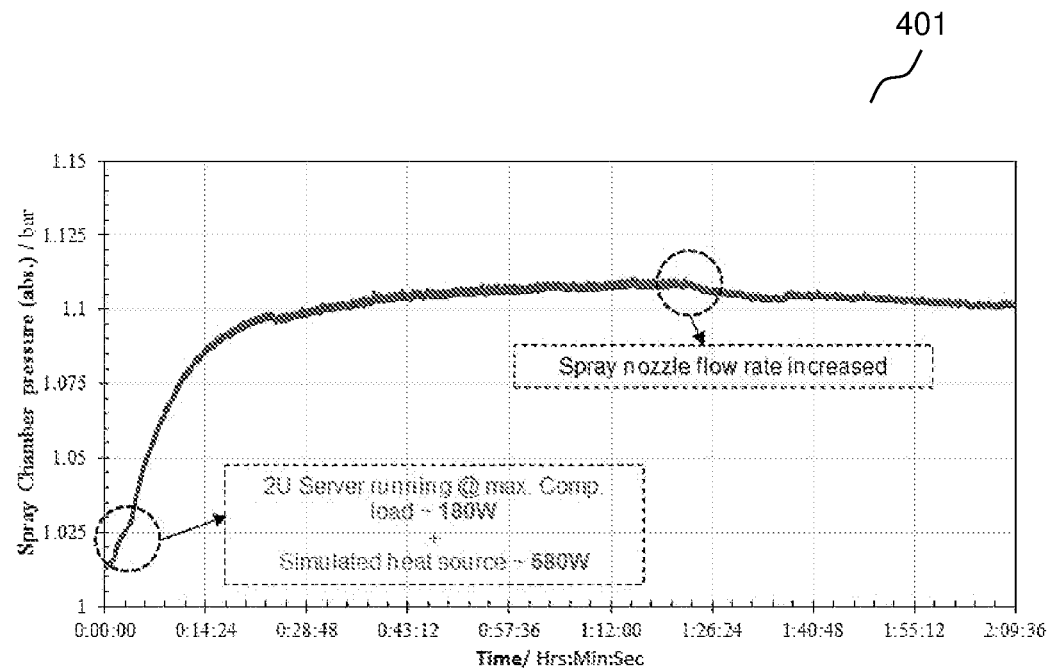
FIG. 4A shows a graph illustrating recorded spray chamber pressure over an operating duration in an experiment.

FIG. 4A shows a graph 401 illustrating recorded spray chamber pressure (or pressure within the server rack enclosure 110) over an operating duration in an experiment. As shown in graph 401, the chamber pressure control may be achieved by varying the heat rejection capacity of the condenser and the nozzle flow rate. At the start of experiment, the server units were set to run at maximum computational load generating about 180 W of equivalent heat load while the simulated heat source (heat blanket) was set to 580 W of heat load. Therefore, the total combined heat load within the spray chamber (or the server rack enclosure 110) adds up to 760 W. Initially the pressure increases as the system is under transient state (before 0:28:00, hr:min:sec). Once the system reaches steady state (i.e. the rate of vapour generation during spray cooling is equal to rate of condensation of vapour by the condenser), the pressure stabilized at 1.11 bar. According to various embodiments, the pressure control method applied in this experiment is to increase flow rate to the volume spray nozzle. It may be observed (from FIG. 4A) that when the flow rate to the volume spray nozzle was increased, the chamber pressure during steady state may be reduced. Accordingly, the chamber pressure may be controlled further. According to various embodiments, there is provided a method of operating the server rack cooling arrangement 100 of FIG. 1 and/or the server rack cooling arrangement 200 of FIG. 2 to regulate a pressure of the interior volume of space 112 enclosed by the server rack enclosure 110. The method may include varying a coolant flow rate through at least one nozzle 150 in a manner so as to vary a rate of vaporization of the coolant within the server rack enclosure 110 with respect to a rate of condensation of the coolant vapour at the central condenser 130.

Figure 4B:
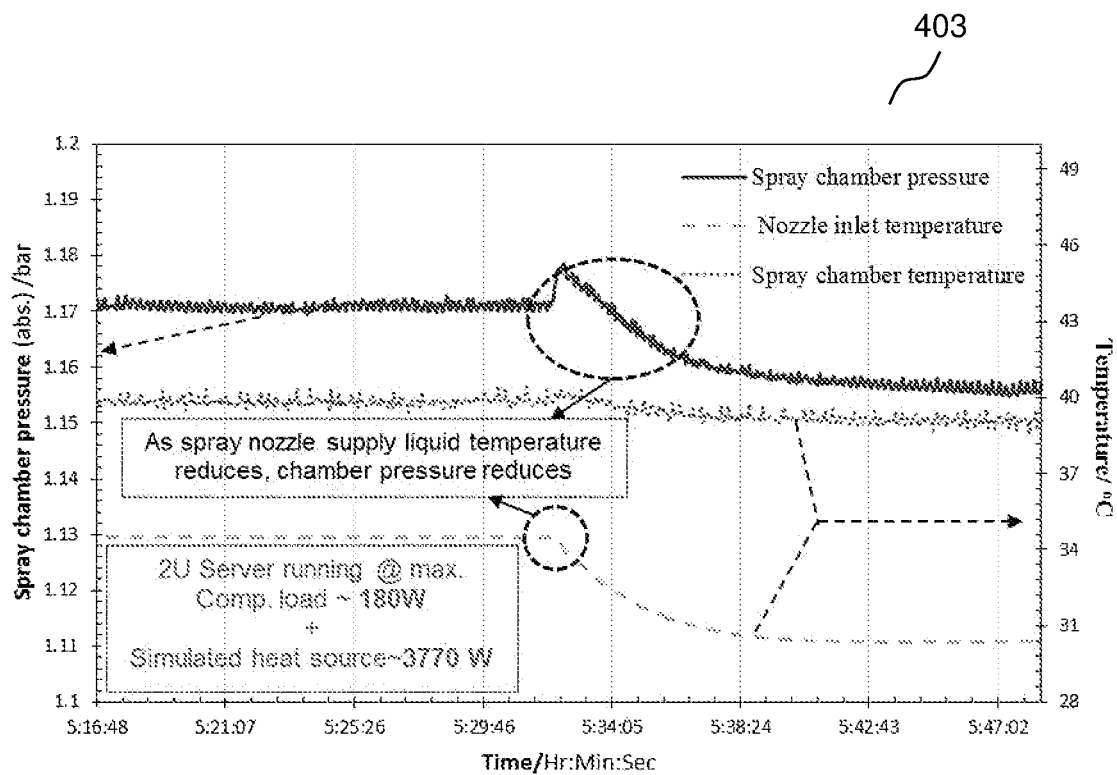
FIG. 4B shows a graph illustrating recorded spray chamber pressure and recorded temperatures of the spray nozzle and the spray chamber respectively during the system operating time in an experiment.

FIG. 4B shows a graph 403 illustrating recorded spray chamber pressure (or pressure within the server rack enclosure 110) and recorded temperatures of the spray nozzle (i.e. nozzle 150) and the spray chamber (i.e. the server rack enclosure 110) respectively during the system operating time in an experiment. As shown in graph 403, chamber pressure control may be achieved by controlling the supply liquid temperature to the spray nozzle. The supply liquid temperature to the nozzle may be controlled by regulating cooling performance of the liquid-liquid heat exchanger 182 (see FIG. 1). From FIG. 4B, it may be seen that as the supply liquid temperature reduces from ~34° C. to ~30° C., the chamber pressure may reduce from 1.17 bar to 1.155 bar as well. The initial spike in pressure when the supply liquid temperature reduces may be due to transient changes to the performance of the liquid-liquid heat exchanger 182. It may also be noted that when the chamber pressure reduces, the chamber temperature may also reduce by 1-2° C. According to various embodiments, there is provided a method of operating the server rack cooling arrangement 100 of FIG. 1 and/or the server rack cooling arrangement 200 of FIG. 2 to regulate a pressure of the interior volume of space 112 enclosed by the server rack enclosure 110. The method may include varying a temperature of a coolant supply to the at least one nozzle 150 in a manner so as to vary a rate of vaporization of the coolant within the server rack enclosure 110 with respect to a rate of condensation of the coolant vapour at the central condenser 130.

Figure 4C:
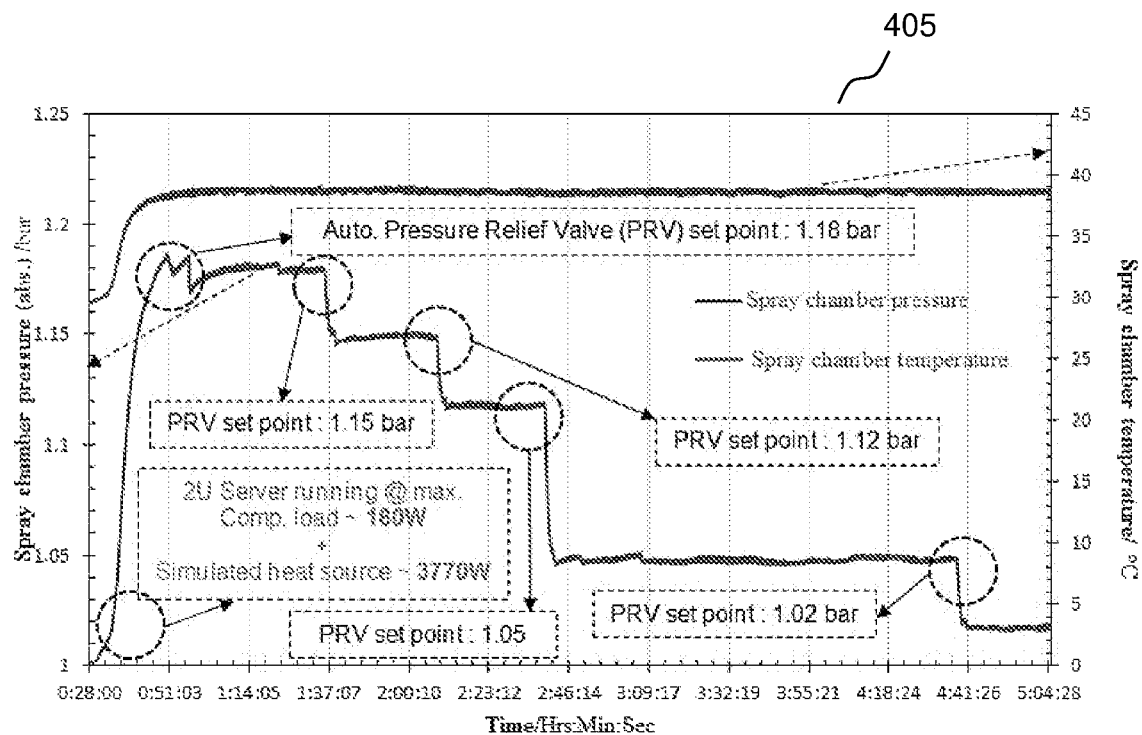
FIG. 4C shows a graph illustrating recorded spray chamber pressure and recorded spray chamber temperature during the system operating time in an experiment.

FIG. 4C shows a graph 405 illustrating recorded spray chamber pressure (or pressure within the server rack enclosure 110) and recorded spray chamber temperature (or temperature within the server rack enclosure 110) during the system operating time in an experiment. As shown in graph 405, the chamber pressure may be controlled by varying the heat rejection capacity of the central condenser 130 and the pressure relief valve 284. The pressure relief valve 284 may release air-vapour mixture to the atmosphere. At the start of experiment, the server units were set to run at maximum computational load generating about 180 W of equivalent heat load while the simulated heat source (heat blanket) was set to 3770 W of heat load and so the total combined heat load within the spray chamber (or the server rack enclosure 110) adds up to 3950 W. The central condenser 130 is supplied with ambient temperature water of 30° C. During transient state (before 0:51:00, hr:min:sec), the pressure relief valve 284 was set to release the pressure in the spray chamber if the chamber pressure exceeds 1.18 bar. Thereafter, the controller releases the pressure until the system reaches steady state pressure of 1.18 bar. The steady state is achieved (after 1:14:00, hr:min:sec) due to continuous operation of the central condenser 130 simultaneously. Similarly, it may be noted that once the set point pressure in the pressure relief valve 284 changed subsequently, the system reaches to set point pressure within 4 mins. Also, at the end of the system operation, the pressure relief valve 284 was set to 1.02 bar which is close to operating near atmospheric pressure. Thereafter, the chamber pressure reaches and maintained to operate at 1.02 bar. According to various embodiments, there is provided a method of operating the server rack cooling arrangement 100 of FIG. 1 and/or the server rack cooling arrangement 200 of FIG. 2 to regulate a pressure of the interior volume of space 112 enclosed by the server rack enclosure 110. The method may include operating the pressure relief valve 284 to control an amount of air-vapour mixture to be released from the server rack enclosure 110.

Figure 4D:
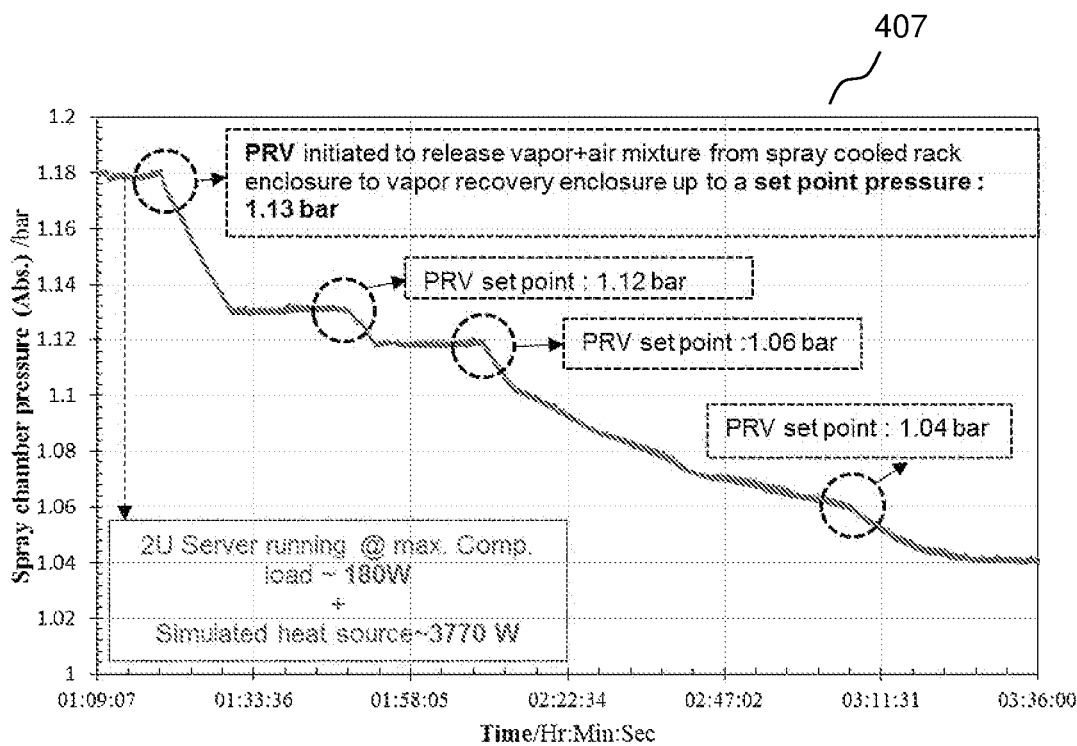
FIG. 4D shows a graph illustrating recorded spray chamber pressure when operating the server rack cooling arrangement in tandem with the vapour recovery system in an experiment.

FIG. 4D shows a graph 407 illustrating recorded spray chamber pressure (or pressure within the server rack enclosure 110) when operating the server rack cooling arrangement 200 in tandem with the vapour recovery system in an experiment. The conditions of the server rack cooling arrangement 200 are similar to the abovementioned condition of FIG. 4C, except that the pressure relief valve 284 now releases air-vapour mixture to the vapour recovery system instead of the atmosphere. Comparing FIG. 4C and FIG. 4D, similar pressure range may be achieved in the spray cooled rack system regardless whether the PRV releases to atmosphere or vapour recovery system. From the preliminary experiments conducted, the recovery efficiency ((i.e. the fluid gained in vapour recovery system/the fluid lost in spray cooled system)*100%) of vapour recovery system may reach as high as 80%.

FIG. 4E shows a table illustrating a density comparison between conventional air cooled server and the spray cooled server of the various embodiments based on the preliminary studies. As shown, heat rejection density of the spray cooled server of the various embodiments is estimated to be 16 kW/m$^3$, which is higher than the conventional commercial air cooled average rack density of 7 kW/rack. The density of the conventional air cooled server is extracted from https://datacenterfrontier.com/rack-density-trends-higher-but-ai-could-boost-a-high-density-horizon/.

Various embodiments relate to a server rack cooling arrangement (or a closed loop spray cooling system) which may eliminate the need for high energy consuming chillers, as well as reduce the energy requirements of the other associated equipment for data centres. According to various embodiments, the server rack cooling arrangement (or the spray cooling system) may include a rack enclosure, electronic components, a spray nozzle array, a rear door condenser, a recirculating air-vapour network, a coolant delivery and recovery system, and an external cooling tower.

According to various embodiments, the rack enclosure may be sealed for preventing the loss of vaporized coolant, and may house the electronic components, the spray nozzle array, the rear door condenser, the recirculating air-vapour network, and the coolant delivery and recovery system.

According to various embodiments, the spray nozzle array may be pumped with high pressure coolant from the reservoir within the rack enclosure for dispensing atomized coolant at/across the surfaces of the electronic components.

According to various embodiments, the condenser coils may be positioned adjacent to the electronic components for condensation of vaporized coolant. According to various embodiments, the condenser coils may include arrays of tube banks which may be suitable for vapour condensation on external surfaces with the presence of non-condensable gas. According to various embodiments, the internal tube channels of the condenser coils may be supplied with return water from the cooling tower/air-to-water heat exchanger hence eliminating the need for a chiller system.

According to various embodiments, the recirculating air-vapour network may recirculate air-vapour mixture within the rack enclosure in order to facilitate atomized coolant to reach all the heated electronic components to pick up heat and to move vaporized coolant towards the rear door condenser coils for heat rejection.

According to various embodiments, the coolant delivery and recovery system may include a coolant reservoir, a delivery mean for receiving condensed coolant from the condenser and electronic components, and for delivering coolant from the reservoir to the spray nozzle array, and a liquid-to-liquid heat exchanger for heat rejection from the coolant before delivery to the spray nozzle arrays.

According to various embodiments, the external cooling tower/air-to-liquid heat exchanger may receive and supply ambient temperature water to the condenser coils and liquid-to-liquid heat exchanger.

According to various embodiments, there may be provided a vapour recovery system working in tandem with the spray cooled rack system during pressure regulating phase, which may reduce/minimize the fluid loss during system operation.

The following pertain to various embodiments.

According to various embodiments, there is provided a server rack cooling arrangement. The server rack cooling arrangement may include a server rack enclosure which may define a single undivided interior volume of space and which may be configured to be sealable to isolate the interior volume of space. The server rack cooling arrangement may further include two or more open-frame-server-units which may be disposed within the interior volume of space and which may be arranged in a multi-level arrangement. Heat-producing-electronic-components of respective open-frame-server-units may be exposed to environmental conditions of the interior volume of space. The server rack cooling arrangement may further include a central condenser disposed within the interior volume of space and towards a rear of the server rack enclosure. The server rack cooling arrangement may further include a coolant reservoir disposed with respect to the central condenser within the interior volume of space in a manner so as to collect condensate from the central condenser. The server rack cooling arrangement may further include at least one nozzle in fluid communication with the coolant reservoir. The at least one nozzle may be configured to deliver fine coolant droplets into the interior volume of space for impingement on the heat-producing-electronic-components. The server rack cooling arrangement may further include at least one fan configured to generate an air-vapour flow within the interior volume of space and through the two or more open-frame-server-units from a front of the server rack enclosure to the rear of the server rack enclosure in a manner so as to carry coolant vapour generated from impingement of the fine coolant droplets on the heat-producing-electronic-components to the central condenser.

According to various embodiments, the at least one nozzle may include a first nozzle and a second nozzle. According to various embodiments, the first nozzle may be oriented with a spray axis perpendicular to a surface of a first heat-producing-electronic-component, and/or the first nozzle may be oriented with a spray axis perpendicular to the airflow. According to various embodiments, the second nozzle may be oriented with a spray axis inclined or parallel with respect to the airflow, and/or the second nozzle may be oriented with a spray axis inclined or parallel to a surface of a second heat-producing-electronic-component.

According to various embodiments, the first nozzle may include a direct spray impingement nozzle and the second nozzle may include a mist spray nozzle.

According to various embodiments, the first nozzle may be disposed within a first of the two or more open-frame-server-units, and the second nozzle may be disposed within a second of the two or more open-frame-server-units.

According to various embodiments, the server rack cooling arrangement may further include a return duct connecting the rear of the server rack enclosure to the front of the server rack enclosure in a manner so as to recirculate air-vapour mixture which has passed through the central condenser back into the interior volume of space.

According to various embodiments, the server rack cooling arrangement may further include at least one circulation fan coupled along the return duct.

According to various embodiments, the server rack cooling arrangement may further include a cooling tower/air-to-water heat exchanger coupled to the central condenser.

According to various embodiments, the server rack cooling arrangement may further include a liquid-to-liquid heat exchanger connected between the coolant reservoir and the at least one nozzle.

According to various embodiments, the cooling tower may also be coupled to the liquid-to-liquid heat exchanger.

According to various embodiments, each of the two or more open-frame-server-units may include a first opening directed towards the front of the server rack enclosure and a second opening directed towards the rear of the server rack enclosure.

According to various embodiments, the server rack enclosure may include at least one pressure relief valve configured to release air-vapour mixture from the interior volume of space of the server rack enclosure.

According to various embodiments, the server rack cooling arrangement may further include a vapour recovery tank fluidly coupled to the pressure relief valve. According to various embodiments, the vapour recovery tank may contain a cooling medium. According to various embodiments, the vapour recovery tank may include a cooling coil immersed in the cooling medium contained inside the vapour recovery tank. According to various embodiments, the vapour recovery tank may include an inlet conduit extending from the pressure relief valve into the cooling medium contained inside the vapour recovery tank. According to various embodiments, the vapour recovery tank may include a fluid outlet at the bottom of the vapour recovery tank. According to various embodiments, the vapour recovery tank may include an air vent at the top of the vapour recovery tank.

According to various embodiments, there is provided a first method of operating the server rack cooling arrangement as described herein to regulate a pressure of the interior volume of space enclosed by the server rack enclosure. According to various embodiments, the method may include varying a coolant flow rate through the at least one nozzle in a manner so as to vary a rate of vaporization of the coolant within the server rack enclosure with respect to a rate of condensation of the coolant vapour at the central condenser.

According to various embodiments, there is provided a second method of operating the server rack cooling arrangement as described herein to regulate a pressure of the interior volume of space enclosed by the server rack enclosure. According to various embodiments, the method may include varying a temperature of a coolant supply to the at least one nozzle in a manner so as to vary a rate of vaporization of the coolant within the server rack enclosure with respect to a rate of condensation of the coolant vapour at the central condenser.

According to various embodiments, there is provided a third method of operating the server rack cooling arrangement as described herein to regulate a pressure of the interior volume of space enclosed by the server rack enclosure. According to various embodiments, the method may include operating the pressure relief valve to control an amount of air-vapour mixture to be released from the server rack enclosure.

Various embodiments have provided a server rack cooling arrangement (or a closed loop spray cooling system) which may eliminate the need for high energy consuming chillers, as well as reduce the energy requirements of the other associated equipment for data centres. According to various embodiments, the server rack cooling arrangement may be more efficient and effective than the conventional air-cooling arrangement.

While the invention has been particularly shown and described with reference to specific embodiments, it should be understood by those skilled in the art that various changes, modification, variation in form and detail may be made therein without departing from the scope of the invention as defined by the appended claims. The scope of the invention is thus indicated by the appended claims and all changes which come within the meaning and range of equivalency of the claims are therefore intended to be embraced.

The invention claimed is:

1. A server rack cooling arrangement, comprising:
a server rack enclosure which defines a single undivided interior volume of space and which is configured to be sealable to isolate the interior volume of space;
two or more open-frame-server-units which are disposed within the interior volume of space and which are arranged in a multi-level arrangement, wherein heat-producing-electronic-components of respective open-frame-server-units are exposed to environmental conditions of the interior volume of space;
a central condenser disposed within the interior volume of space and towards a rear of the server rack enclosure;
a coolant reservoir disposed with respect to the central condenser within the interior volume of space in a manner so as to collect condensate from the central condenser;
at least one nozzle in fluid communication with the coolant reservoir, wherein the at least one nozzle is configured to deliver coolant droplets into the interior volume of space for impingement on the heat-producing-electronic-components; and
at least one fan configured to generate an air-vapour flow within the interior volume of space and through the two or more open-frame-server-units from a front of the server rack enclosure to the rear of the server rack enclosure in a manner so as to carry coolant vapour generated from impingement of the coolant droplets on the heat-producing-electronic-components to the central condenser.

2. The arrangement as claimed in claim 1, wherein the at least one nozzle comprises a first nozzle and a second nozzle.

3. The arrangement as claimed in claim 2, wherein the first nozzle is oriented with a spray axis perpendicular to the air-vapour flow.

4. The arrangement as claimed in claim 3, wherein the second nozzle is oriented with a spray axis inclined or parallel with respect to the air-vapour flow.

5. The arrangement as claimed in claim 4, wherein the first nozzle is disposed within a first of the two or more open-frame-server-units, and the second nozzle is disposed within a second of the two or more open-frame-server-units.

6. The arrangement as claimed in claim 2, wherein the first nozzle comprises a direct spray impingement nozzle and the second nozzle comprises a mist spray nozzle.

7. The arrangement as claimed in claim 6, wherein the first nozzle is disposed within a first of the two or more open-frame-server-units, and the second nozzle is disposed within a second of the two or more open-frame-server-units.

8. The arrangement as claimed in claim 2, wherein the first nozzle is oriented with a spray axis perpendicular to a surface of a first heat-producing-electronic-component.

9. The arrangement as claimed in claim 8, wherein the second nozzle is oriented with a spray axis inclined or parallel to a surface of a second heat-producing-electronic-component.

10. The arrangement as claimed in claim 1, further comprising a return duct connecting the rear of the server rack enclosure to the front of the server rack enclosure in a manner so as to recirculate air-vapour mixture which has passed through the central condenser back into the interior volume of space.

11. The arrangement as claimed in claim 10, further comprising at least one circulation fan coupled along the return duct.

12. The arrangement as claimed in claim 1, further comprising an air-to-liquid heat exchanger coupled to the central condenser.

13. The arrangement as claimed in claim 12, further comprising a liquid-to-liquid heat exchanger connected between the coolant reservoir and the at least one nozzle.

14. The arrangement as claimed in claim 13, wherein the air-to-liquid heat exchanger is also coupled to the liquid-to-liquid heat exchanger.

15. The arrangement as claimed in claim 1, wherein each of the two or more open-frame-server-units comprises a first opening directed towards the front of the server rack enclosure and a second opening directed towards the rear of the server rack enclosure.

16. The arrangement as claimed in claim 1, wherein the server rack enclosure comprises at least one pressure relief valve configured to release air-vapour mixture from the interior volume of space of the server rack enclosure.

17. The arrangement as claimed in claim 16, further comprising a vapour recovery tank fluidly coupled to the pressure relief valve.

18. The arrangement as claimed in claim 17, wherein the vapour recovery tank contains a cooling medium, and wherein the vapour recovery tank comprises
 a cooling coil immersed in the cooling medium contained inside the vapour recovery tank,
 an inlet conduit extending from the pressure relief valve into the cooling medium contained inside the vapour recovery tank,
 a fluid outlet at the bottom of the vapour recovery tank, and
 an air vent at the top of the vapour recovery tank.

19. A method of operating the server rack cooling arrangement, wherein the server rack cooling arrangement comprises a server rack enclosure which defines a single undivided interior volume of space and which is configured to be sealable to isolate the interior volume of space; two or more open-frame-server-units which are disposed within the interior volume of space and which are arranged in a multi-level arrangement, wherein heat-producing-electronic-components of respective open-frame-server-units are exposed to environmental conditions of the interior volume of space; a central condenser disposed within the interior volume of space and towards a rear of the server rack enclosure; a coolant reservoir disposed with respect to the central condenser within the interior volume of space in a manner so as to collect condensate from the central condenser; at least one nozzle in fluid communication with the coolant reservoir, wherein the at least one nozzle is configured to deliver coolant droplets into the interior volume of space for impingement on the heat-producing-electronic-components; and at least one fan configured to generate an air-vapour flow within the interior volume of space and through the two or more open-frame-server-units from a front of the server rack enclosure to the rear of the server rack enclosure in a manner so as to carry coolant vapour generated from impingement of the coolant droplets on the heat-producing-electronic-components to the central condenser, the method being for regulating a pressure of the interior volume of space enclosed by the server rack enclosure, the method comprising:
 varying a coolant flow rate through the at least one nozzle in a manner so as to vary a rate of vaporization of the coolant within the server rack enclosure with respect to a rate of condensation of the coolant vapour at the central condenser.

20. A method of operating the server rack cooling arrangement, wherein the server rack cooling arrangement comprises a server rack enclosure which defines a single undivided interior volume of space and which is configured to be sealable to isolate the interior volume of space; two or more open-frame-server-units which are disposed within the interior volume of space and which are arranged in a multi-level arrangement, wherein heat-producing-electronic-components of respective open-frame-server-units are exposed to environmental conditions of the interior volume of space; a central condenser disposed within the interior volume of space and towards a rear of the server rack enclosure; a coolant reservoir disposed with respect to the central condenser within the interior volume of space in a manner so as to collect condensate from the central condenser; at least one nozzle in fluid communication with the coolant reservoir, wherein the at least one nozzle is configured to deliver coolant droplets into the interior volume of space for impingement on the heat-producing-electronic-components; and at least one fan configured to generate an air-vapour flow within the interior volume of space and through the two or more open-frame-server-units from a front of the server rack enclosure to the rear of the server rack enclosure in a manner so as to carry coolant vapour generated from impingement of the coolant droplets on the heat-producing-electronic-components to the central condenser, the method being for regulating a pressure of the interior volume of space enclosed by the server rack enclosure, the method comprising:
 varying a temperature of a coolant supply to the at least one nozzle in a manner so as to vary a rate of vaporization of the coolant within the server rack enclosure with respect to a rate of condensation of the coolant vapour at the central condenser.

* * * * *